United States Patent [19]

Esquivel et al.

[11] Patent Number: 4,905,062
[45] Date of Patent: Feb. 27, 1990

[54] PLANAR FAMOS TRANSISTOR WITH TRENCH ISOLATION

[75] Inventors: Agerico L. Esquivel, Dallas; Allan T. Mitchell, Garland, both of Tex.

[73] Assignee: Texas Instruments Incorporated, Dallas, Tex.

[21] Appl. No.: 312,398

[22] Filed: Feb. 17, 1989

Related U.S. Application Data

[63] Continuation of Ser. No. 122,952, Nov. 19, 1987, abandoned.

[51] Int. Cl.$^4$ .................. H01L 29/78; H01L 27/10; H01L 27/12; H01L 29/34
[52] U.S. Cl. .................. 357/23.5; 357/23.11; 357/45; 357/49; 357/54; 357/55
[58] Field of Search .................. 357/23.5, 23.11, 49, 357/54, 55, 45; 365/185

[56] References Cited

U.S. PATENT DOCUMENTS

| | | | |
|---|---|---|---|
| 4,409,723 | 10/1983 | Harari | 357/23.5 |
| 4,597,060 | 6/1986 | Mitchell et al. | |
| 4,698,900 | 10/1987 | Esquivel | |
| 4,713,142 | 12/1987 | Mitchell et al. | |
| 4,729,006 | 3/1988 | Dally et al. | 357/23.11 |
| 4,763,177 | 8/1988 | Paterson | 357/23.5 |

FOREIGN PATENT DOCUMENTS

| | | | |
|---|---|---|---|
| 0160965 | 11/1985 | European Pat. Off. | 357/23.5 |
| 62-43180 | 2/1987 | Japan | 357/23.5 |

OTHER PUBLICATIONS

Sekiya et al., "Trench Self–Aligned EPROM Technology", 1986 VLSI Symposium.

Primary Examiner—J. Carroll
Attorney, Agent, or Firm—Rodney M. Anderson; Melvin Sharp

[57] ABSTRACT

A sealed gate FAMOS transistor (28) disposes a thermal oxide layer (40) about the floating gate (34) in order to isolate the floating gate (34) from the planar isolating regions (44) between floating gates (34). Trench isolating regions (54) are provided between control gates (50) to enhance programmability of the sealed gate FAMOS transistor (28).

8 Claims, 3 Drawing Sheets

PLANAR FAMOS TRANSISTOR WITH TRENCH ISOLATION

This application is a continuation, of application Ser. No. 07/122,952, filed Nov. 19, 1987, abandoned.

TECHNICAL FIELD OF THE INVENTION

This invention pertains in general to semiconductor devices, and more particularly to a FAMOS transistor array having trench isolation, and a method of forming the same.

BACKGROUND OF THE INVENTION

Traditionally, EPROMs and EEPROMs have been implemented using a non-planar FAMOS technology. The non-planar technology has several inherent problems which can be solved by the use of a planar technology. U.S. Pat. No. 4,597,060 to Mitchell describes a method of forming a FAMOS cell which is planarized.

The planar technology provides for a small memory cell, which is more reliable and which has enhanced programming capabilities. Despite the superior qualities of the planar FAMOS transistor, a programming voltage of 12.5 volts is still necessary for reliable programming. In order to reduce the magnitude of the electric fields created during programming, it is desirable that the programming voltage be reduced. Preferably, the programming voltage should approach five volts.

Therefore, a need has arisen for a planar and non-planar FAMOS technology for use in EPROMs, EEPROMs, EPALs, and other devices using similar memory structures, in which the programming voltage is reduced, and the reliability of the devices increased.

SUMMARY OF THE INVENTION

In accordance with the present invention, a non-volatile memory and method of producing the same is provided herein, which substantially eliminates or prevents the disadvantages and problems associated with prior EPROM and EEPROM devices.

In one aspect of the present invention, a non-volatile memory cell comprises a planar FAMOS transistor having a floating gate and a control gate. A thermal oxide is formed on the floating gate, and dielectric regions, typically deposited dichlorosilane oxide, are formed to the sides of the floating gate. By "sealing" the floating gate with a high quality dielectric, such as thermal oxide, the programmability of the FAMOS transistor is greatly enhanced. Trench isolation is used to isolate the FAMOS transistors in an array.

The trench isolation, in combination with the sealed floating gate, produces a FAMOS transistor with a significant improvement in programmability over non-trench isolated FAMOS transistors, and over trench isolated FAMOS transistors without sealed floating gates.

In the present invention, the trench isolated sealed gate FAMOS transistor of the present invention may be programmed at five volts, which is a significant technical advantage over prior art FAMOS transistors which required 12.5 volts. The planar sealed gate FAMOS transistor has the advantages of better programmability due to shallow junctions, less danger of bit line punch-through, and a planar topography.

BRIEF DESCRIPTION OF THE DRAWINGS

For a more complete understanding of the present invention and the advantages thereof, reference is now made to the following description now taken in conjunction with the accompanying drawings in which.

DETAILED DESCRIPTION OF THE INVENTION

The preferred embodiment of the present invention is best understood by referring to FIGS. 1-7 of the drawings, like numerals being used for like and corresponding parts of the various drawings.

Figure 1:
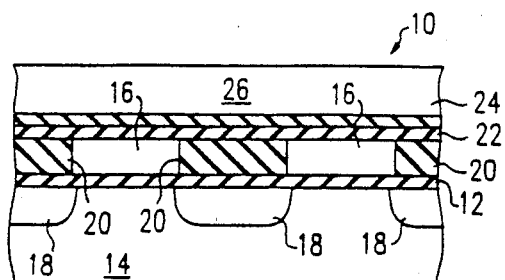
FIG. 1 is a cross-sectional side view of the prior art planar FAMOS cell described in connection with U.S. Pat. No. 4,597,060.

FIG. 1 illustrates a prior art planar FAMOS transistor, as described in U.S. Pat. No. 4,597,060 to Mitchell, which is incorporated by reference herein. Unlike previous non-planar EPROM cells, the planar FAMOS transistor does not use a locally oxided silicon (LOCOS) process to isolate individual bits.

The planar FAMOS transistor 10 is fabricated as follows. A gate oxide 12 is grown on top of a silicon substrate 14 to a thickness of about 350 angstroms. A polysilicon layer is deposited over the gate oxide 12 and is patterned and etched to form the floating gates 16. Arsenic is implanted and diffused in the slots between the polysilicon gate 16 forming the N. source and drain regions 18. After a buried N implant, a conformal CVD TEOS (tetaaethyl orthosilicate) oxide is deposited on the surface of the wafer to fill in the slots. A photoresist is spun on the wafer, and a planarizing plasma etch that etches both oxide and photoresist layers at the same rate is used to remove the TEOS oxide over the floating gates 16, thereby leaving planar oxide regions 20 between the floating gates 16. Interlevel oxide (ILO) 22 and interlevel nitride (ILN) 24 layers are formed over the planar oxide regions 20 and floating gates 16 to an equivalent oxide thickness of 350 angstroms. The control gate 26 comprising a second polysilicon layer is formed over the ILN 24.

While the prior art planar FAMOS transistor 10 of FIG. 1 has notable advantages over previous non-planar devices, the programming characteristics can be improved by the planar FAMOS transistor of the present invention.

Figure 2:
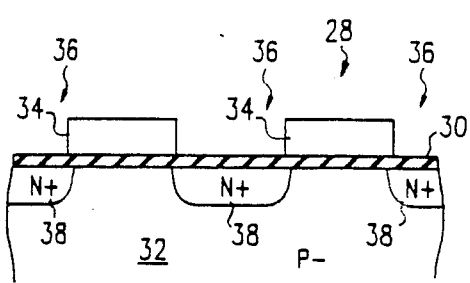
FIG. 2 is a cross-sectional side view of the planar FAMOS transistor of the present invention after a first processing stage.

FIG. 2 illustrates a cross-sectional side view of the sealed gate planar FAMOS transistor 28 of the present invention after a first processing stage. A gate oxide 30 is formed on a substrate 32 using well known processes. A polysilicon layer is deposited on the gate oxide 30, and is patterned and etched to form the floating gates 34 using standard photolithographic techniques. Arsenic or another suitable dopant is implanted in the slots 36 between floating gates 34 to form the buried N+ source and drain regions 38.

Figure 3:
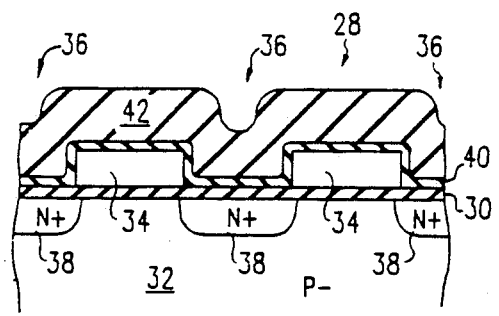
FIG. 3 is a cross-sectional side view of the planar FAMOS transistor of the present invention after a second processing stage.

FIG. 3 illustrates a cross-sectional view of the sealed gate planar FAMOS transistor 28 of the present invention after a second processing stage. In an important aspect, a high quality dielectric layer 40, such as thermal oxide (hereinafter "sealing thermal oxide layer" 40) is formed over the floating gates 34 in order to "seal" the floating gates 34. Hence, the floating gates 34 are covered on all sides by a high quality dielectric: on the bottom by the gate oxide 30, which is a thermally grown oxide, and on the sides and top by the sealing thermal oxide 40.

A thick oxide layer 42 is deposited over the sealing thermal oxide 40 such that the slots 36 are completely filled with the deposited oxide. The thick oxide layer 42 may comprise a TEOS oxide or a DCS (dichlorosilane) +N$_2$O oxide. In the preferred embodiment, a DSC oxide is used; however, dielectrics other than oxides may be used so far as they have suitable isolating characteristics.

Figure 4:
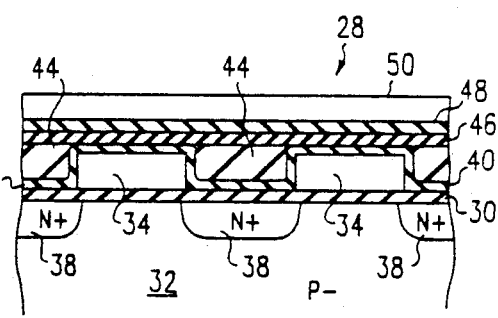
FIG. 4 is a cross-sectional side view of the planar FAMOS transistor of the present invention after a third processing stage.

FIG. 4 illustrates the sealed gate planar FAMOS transistor 28 after a third processing stage. The thick oxide layer 42 is planarized to form isolating regions 44 between floating gates 34. The thick oxide layer may be planarized by using an oxide Resist-Etch-Back (REB) process. Using this technique, a Shipley 1400-17 resist is spun-coated to 0.6 micrometers thickness over a 0.6 micrometer thick oxide layer. A fifteen minute white light exposure and a thirty minute 200° C. convection oven hard bake may be employed to ensure complete resist flow. An etch having an equal selectivity to oxide and resist may be used to planarize the thick oxide layer 42. The oxide resist selectivity may be controlled by adding small amounts of O$_2$ to an etch chemistry of CHF$_3$+C$_2$F$_6$+He at 1.5 Torr and 280 watts of 13.5 MHz power. The thick oxide layer 44 should be etched down to the top of the sealing thermal oxide layer 40 over the floating gates 34.

After planarizing the thick oxide layer 42, a ILO (interlevel oxide) layer 46 and an ILN (interlevel nitride) layer 48 are deposited using CVD techniques over the isolating regions 44 and exposed portions of the sealing thermal oxide 40. The control gates 50 for the memory cells are formed by depositing a layer of polysilicon over the ILN layer 48 and etching the polysilicon layer to form the control gates 50.

The sealing thermal oxide 40 separates the floating gates 34 from the deposited oxide used in the isolating regions 44. The thermal oxide 40 has superior dielectric characteristics relative to the deposited oxide of the isolating regions 44. Hence, the sealing oxide layer 40 improves the degree of isolation between floating gates 34. The greater degree of isolation improves the programmability of the cells, described hereinbelow.

Figure 5:
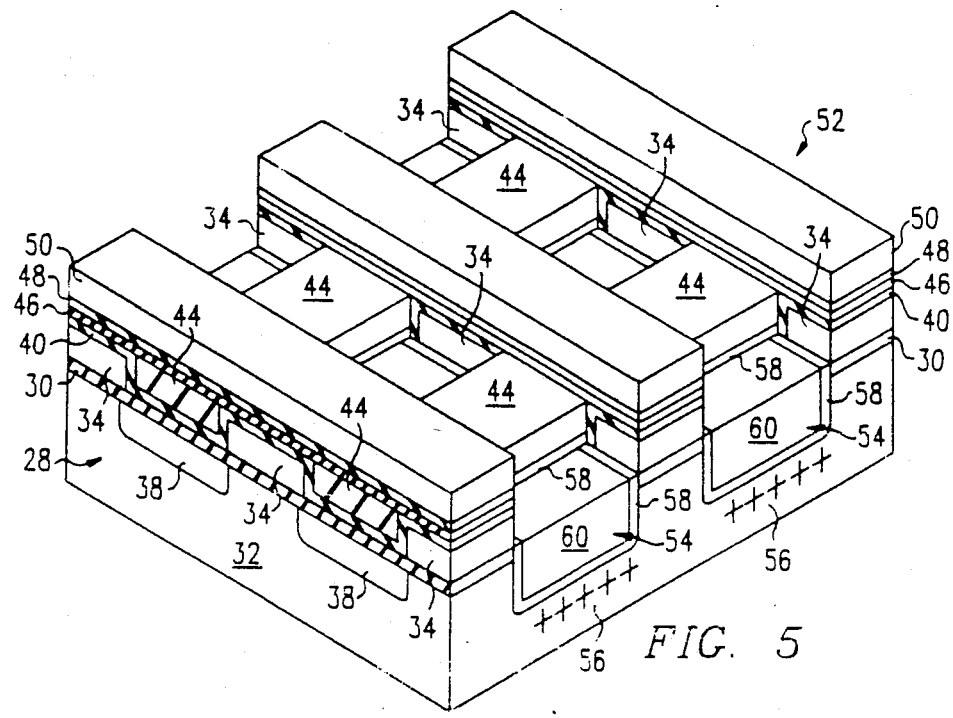
FIG. 5 illustrates an embodiment of the present invention using trench isolation regions to separate bit lines.

FIG. 5 illustrates an embodiment of the present invention, using trench isolation regions to separate the N. source and drain regions 38 (acting as bit lines). In forming the array 52 of sealed gate FAMOS planar transistors 28, portions of the ILN layer 48, ILO layer 46, and floating gates 34, which do not underlie the control gate 50, are etched. Portions of the sealing thermal oxide 40, gate oxide 30, and substrate 32 not underlying either the control gate 50 or the isolating regions 44 are also etched away, forming trenches 54 in the substrate 32. A bit line isolation implant 56 may be formed at the bottom of the trench 54, followed by formation of a thermal oxide 58 on the sidewalls and bottom of the trenches 54. A TEOS oxide 60 may be used to fill the trenches 54. Although the thermal oxide 58 and TEOS oxide 60 have been shown in cutaway view for purposes of illustration, the thermal oxide 58 and TEOS oxide 60 would be formed to the top of the control gate 50 in actual practice. A more detailed description of trench formation is described in U.S. Pat. No. 4,698,900 to Esquivel, which is incorporated by reference herein.

Trench isolation enhances the programmability of a FAMOS transistor 28 having a sealed floating gate 34. Tests have shown that a sealed gate planar FAMOS transistor 28 using trench isolation can be programmed at five volts, a voltage level heretofore unobtainable.

Figure 6:
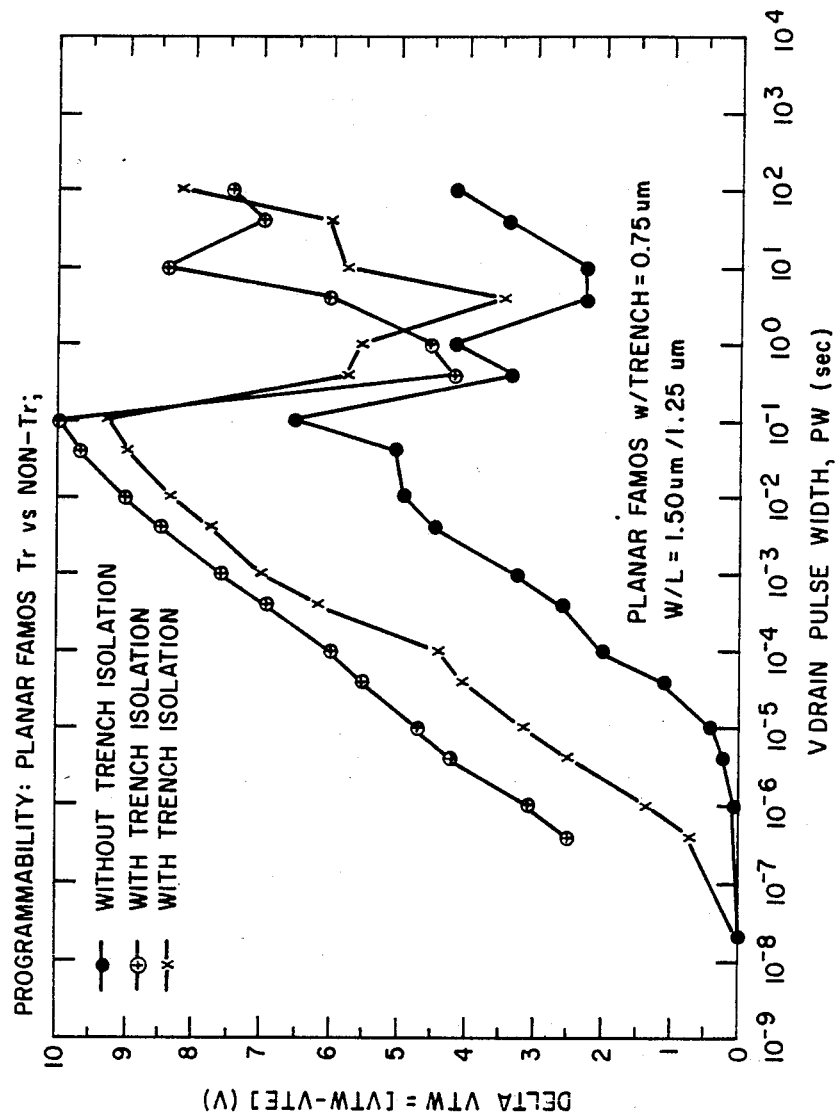
FIG. 6 illustrates a graph of the improved programmability of the planar FAMOS transistor of the present invention.

FIG. 6 shows a graph illustrating the superior programmability of the planar FAMOS transistor with trench isolation in comparison with a non-trench isolated planar FAMOS transistor. The graph illustrates two test slices with trench isolation compared to a test slice without trench isolation. As shown, the trench isolated structure has a much higher delta $V_{tw}$ (i.e., the difference between the transistor threshold voltage $V_{tw}$ in the programmed state and the threshold voltage $V_{te}$ in the erased state) than does the non-trench isolated structure at equal pulse widths. While test data varies depending upon whether the floating gate is sealed with a thermal oxide and upon the type of insulator used between floating gates, trench isolated structures show a consistently higher delta $V_{tw}$. Hence, the trench isolated structure greatly increases the programmability of the planar FAMOS array.

Figure 7:
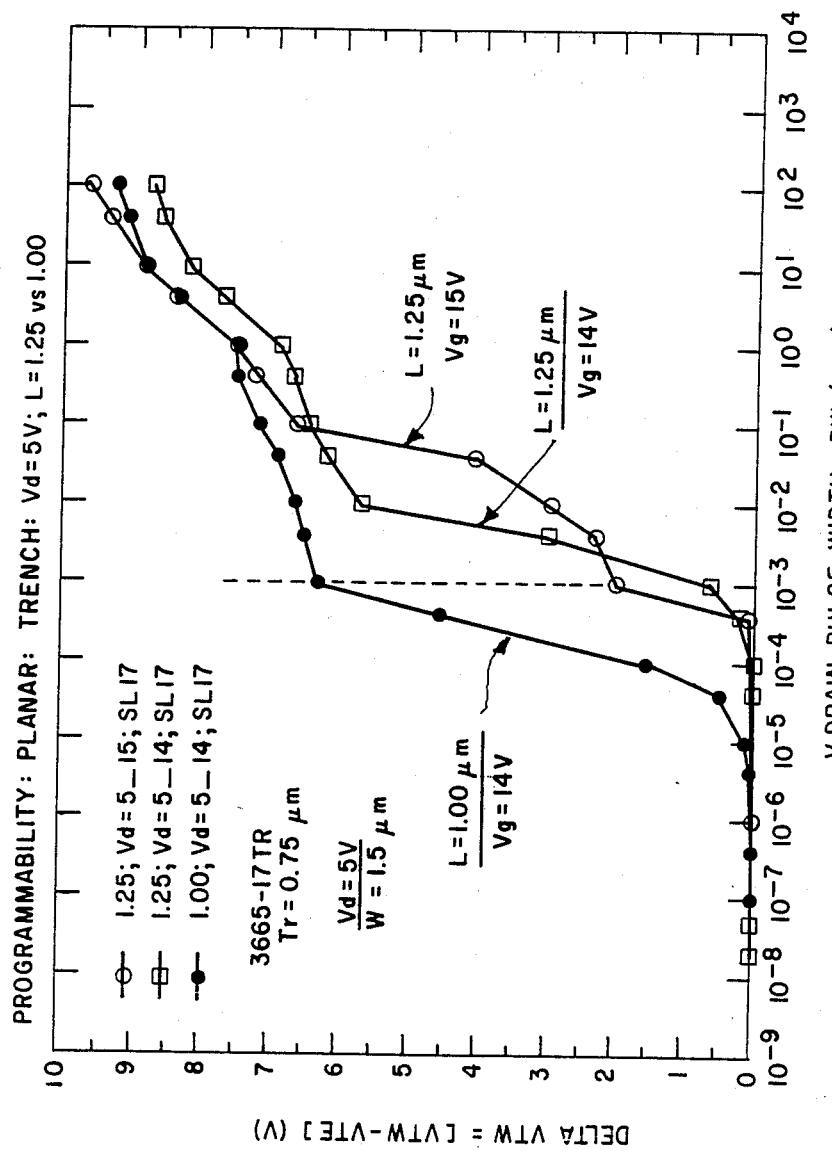
FIG. 7 illustrates a graph of the programmability of the planar FAMOS transistor of the present invention at a $V_d$ of 5 volts.

FIG. 7 illustrates test data on the trench isolated planar transistor of the present invention. As shown, a trench isolated planar transistor having $V_d=5$ volts, $V_g=14$ v and a channel length of 1.0 micrometer, provides a delta $V_{tw}$ of 6.3 volts a 1.0 milliseconds. At 400 microseconds, the delta $V_{tw}$ equals 4.590. This data corresponds to delta $V_{tw}$ of 4.236 and 2.418 for corresponding non-trench isolated structures. Hence, the present invention provides a significant improvement over the prior art.

The present invention provides the technical advantage of increasing the programmability of the shallow junctions of the planar FAMOS transistor, thereby permitting reduction of the devices to sub-micron lengths. It has been estimated that a four micron squared device may be produced using the structure of the present invention. Furthermore, the FAMOS transistor of the present invention may be programmed at five volts.

Although the sealed gate planar FAMOS transistor 28 has been described in connection with a EPROM memory cell, it should be noted that the invention may be used in connection with EEPROMs, Flash EEPROMS, EPALs, and other hybrid EPROM devices, such as FAMOS transistors having floating gates which partially cover the channel between the source and drain.

Although the present invention has been described in detail, it should be understood that various changes, substitutions and alterations can be made herein without departing from the spirit and scope of the invention as defined by the appended claims.

What is claimed is:

1. A non-volatile memory cell array comprising:
   a semiconductor substrate;
   a plurality of doped bit line regions formed in said substrate;
   a plurality of floating gates overlying said substrate, each having a top surface, and each of said floating gates disposed between a pair of bit line regions and defining a channel region in said substrate lying under said floating gate and between said bit line regions;
   a plurality of dielectric structures, each disposed over one of said bit line regions and having a top surface substantially even with the top surfaces of said floating gates;
   a plurality of control gages each overlying a plurality of floating gates and overlying a plurality of dielectric structures and bit line regions therebelow; and
   a plurality of trench isolation regions each disposed between adjacent ones of said floating gates disposed between the same pair of bit line regions, and between adjacent ones of said dielectric structures overlying said pair of bit line regions, said trench isolation regions extending into said substrate substantially below the surface of said channel regions.

2. The memory cell array of claim 1 wherein each of said floating gates have sides insulated by a thermal silicon oxide;
   and wherein said dielectric structures each comprise a deposited dielectric disposed between the insulated sides of adjacent floating gates.

3. The memory cell array of claim 2 wherein said deposited dielectric comprises a deposited silicon oxide.

4. The memory cell array of claim 1 wherein said trench isolation regions each comprise a second dielectric structure disposed within said substrate and separated from said substrate by a sidewall oxide layer.

5. The memory array of claim 1 and further comprising channel stop regions underlying said trench isolation regions.

6. The memory array of claim 1 wherein said floating gates each overlie a portion of the pair of bit line regions adjacent thereto.

7. The memory array of claim 1 wherein said memory cells comprise EPROM memory cells.

8. The memory array of claim 1 wherein said memory cells comprise EEPROM memory cells.

* * * * *